(12) United States Patent
Nguyen et al.

(10) Patent No.: US 11,423,198 B2
(45) Date of Patent: Aug. 23, 2022

(54) AERODYNAMIC DESIGNING METHOD OF THE CENTRAL SECTION OF SMALL SIZE GAS TURBINE ENGINES

(71) Applicant: VIETTEL GROUP, Ha Noi (VN)

(72) Inventors: Truong Giang Nguyen, Ha Noi (VN); Quang Hai Nguyen, Ha Noi (VN); Xuan Long Bui, Ha Noi (VN); Van Son Pham, Ha Noi (VN)

(73) Assignee: VIETTEL GROUP, Ha Noi (VN)

( * ) Notice: Subject to any disclaimer, the term of this patent is extended or adjusted under 35 U.S.C. 154(b) by 130 days.

(21) Appl. No.: 16/920,561

(22) Filed: Jul. 3, 2020

(65) Prior Publication Data
US 2021/0209266 A1    Jul. 8, 2021

(30) Foreign Application Priority Data
Jan. 2, 2020    (VN) .............................. 1-2020-00038

(51) Int. Cl.
*G06F 30/20*    (2020.01)
*G06F 30/15*    (2020.01)
*G06F 30/17*    (2020.01)

(52) U.S. Cl.
CPC .............. *G06F 30/20* (2020.01); *G06F 30/15* (2020.01); *G06F 30/17* (2020.01)

(58) Field of Classification Search
CPC .......... G06F 30/00; G06F 30/20; G06F 30/15; G06F 30/17; Y02T 90/00
(Continued)

(56) References Cited

FOREIGN PATENT DOCUMENTS

EP    2733315 A2 *    5/2014    ............. F01D 25/30

OTHER PUBLICATIONS

Epstein, Alan H., "Millimeter-Scale, Micro-Electro-Mechanical Systems Gas Turbine Engines", Apr. 2004, Journal of Engineering Gas Turbines and Power, ASME. (Year: 2004).*
(Continued)

*Primary Examiner* — Cedric Johnson
(74) *Attorney, Agent, or Firm* — patenttm.us

(57) ABSTRACT

This invention proposes the aerodynamic designing method for the central section of small size gas turbine engine type and it includes the following 8 steps: $1^{st}$ step: checking to confirm if compressor outlet air meets demand specified by the central section; $2^{nd}$ step: estimating the inner casing diameter based on practical experience; $3^{rd}$ step: estimating the outer casing diameter; $4^{th}$ step: estimating the combustor dome height and combustor length; $4^{th}$ step: estimating the combustor dome height and combustor length; $5^{th}$ step: estimating the combustor inner and outer liner diameters; $6^{th}$ step: estimating the exit inner and exit outer diameters of the pre-diffuser; $7^{th}$ step: estimating the dump gap; $8^{th}$ step: verifying rotordynamic properties to determine if the shaft diameter assumption starting in the $2^{nd}$ step is good enough.

1 Claim, 4 Drawing Sheets

(58) Field of Classification Search
USPC .............................................................. 703/1
See application file for complete search history.

(56) References Cited

OTHER PUBLICATIONS

Griffiths, J.P., "Measurements of the Flow Field in a Modern Gas Turbine Combuster", Sep. 1999, Doctor of Philosophy of Loughborough University. (Year: 1999).*

* cited by examiner

AERODYNAMIC DESIGNING METHOD OF THE CENTRAL SECTION OF SMALL SIZE GAS TURBINE ENGINES

TECHNICAL DISCIPLINE SPECIFICATION

This invention relates to the aerodynamic designing method of the central section of small size gas turbine engine. The central section is defined as from the end of compressor to the begin of turbine nozzle guide vane (NGV). It consists of pre-diffuser, the combustor liners and dome, the inner casing and the outer casing. The space between the end of the pre-diffuser and the combustor dome forms the dump region; the space between the inner casing and the inner liner forms the inner annulus channel; similarly, there is the outer annulus channel between the outer liner and the outer casing.

This invention does not attempt to design holes on combustor liners and dome for air flow distribution in the combustor. In fact, that is the job of combustor designers. Instead, this invention focuses on sizing and locating combustor liner liners and domes and other components of the central section. This helps distribute airflow to annulus channels before it goes into the combustor.

Specifically, this method is applied in many technical disciplines like aerospace technologies, mobile gas turbine electric generators having high power/mass ratio serving in mining, petroleum and military vehicles.

TECHNICAL STATUS OF THE INVENTION

The function of gas turbine engine's central section is to slow down exit compressed air from a compressor and distribute this air stream to combustor dome, inner annulus channel and outer annulus channel so that air in these annulus channels will eventually flow into a combustor via holes on combustor liners.

This design method focuses on gas turbine engines with air mass flow rate of less than 9 kg/s (small size) having simple straight annular combustor, FIG. 2 illustrates this design concept.

Generally, straight annular combustor and its associated central section configuration has been designed and incorporated successfully in many gas turbine engines by many companies like Microturbo TRI 60-30, Microturbo TRI 40. However, design methods have not been disclosed.

Academic published papers also have proposed some simplified designs, for example, a combustor is assumed to be symmetric around the nozzle guide vane's mean line in Khandewal's PhD thesis in 2012. These academic simplified designs often serve in narrow disciplines for calculation of aero-thermodynamic properties in simple setup configurations. Those configurations often cannot be applied in gas turbine design in reality due to the lack of harmonic combination with other components or other requirement such as minimization of size or mechanical constrains. In addition, some books like Walsh mention unconnectedly several features of the central section like air speed in the inner/outer annulus channels. However, there exist not any documents that provide systematically and fully aerodynamic parameters' values for each component of the central section and how they combine together.

Therefore, neither in local search nor in global search, it has not been observed any published works by any people or organizations mentioning systematically the aerodynamic design method of the central section of gas turbine engine with the following characteristics: sizing starts with minimum space needed for rotor-dynamic design and auxiliary devices, the pre-diffuser is guided to the combustor's dome center and the balance between the ratio of the combustor's cross sectional area to the reference area and the ratio of the inner annulus channel to the outer annulus channel.

In order to solve the design problem, the authors have proposed the new aerodynamic design method for the central section of gas turbine engine having straight annular combustor. This method features guaranteed reliable aerodynamic quality of the central section as well as quick processing time.

TECHNICAL PRINCIPLE OF THE INVENTION

The ultimate goal of the invention is to propose the aerodynamic design method for the central section of a small size gas turbine engine taking into account mechanical aspect of other components such as common shaft diameter needed. Designing procedure is quick, high fidelity and backed by practical experience.

In order to archive the above goal, the proposed design method includes the following eight (08) steps:

$1^{st}$ step: checking to confirm if compressor outlet air meets demand specified by the central section $2^{nd}$ step: estimating the inner casing diameter based on practical experience $3^{rd}$ step: estimating the outer casing diameter $4^{th}$ step: estimating the combustor dome height and combustor length $5^{th}$ step: estimating the combustor inner and outer liner diameters $6^{th}$ step: estimating the exit inner and exit outer diameters of the pre-diffuser $7^{th}$ step: estimating the dump gap $8^{th}$ step: verifying rotordynamic properties to determine if the shaft diameter assumption starting in the $2^{nd}$ step is good enough. If not, initiating the new design loop by increasing the shaft diameter, hence the inner casing diameter.

The whole design process is backed by internally practical data and the simulation process is conducted on commercial softwares.

DETAILED DESCRIPTION OF THE INVENTION

The following paragraphs describe clearly and exhaustively the aerodynamic design method of small gas turbine engine with attached figures. This description is just examples not mentioning all possible outcomes of the invention. It will be apparent to those skilled in the art that many changes and modifications may be made without departing from the broader aspects. The appended claims are therefore intended to cover all such changes and modifications as fall within the true spirit and scope of the technology.

Except for rotordynamic simulation and aerodynamic simulation to verify the design formed after the proposed steps above, all processes are backed by practical experience of Viettel Group, the assignee.

Figure 2:
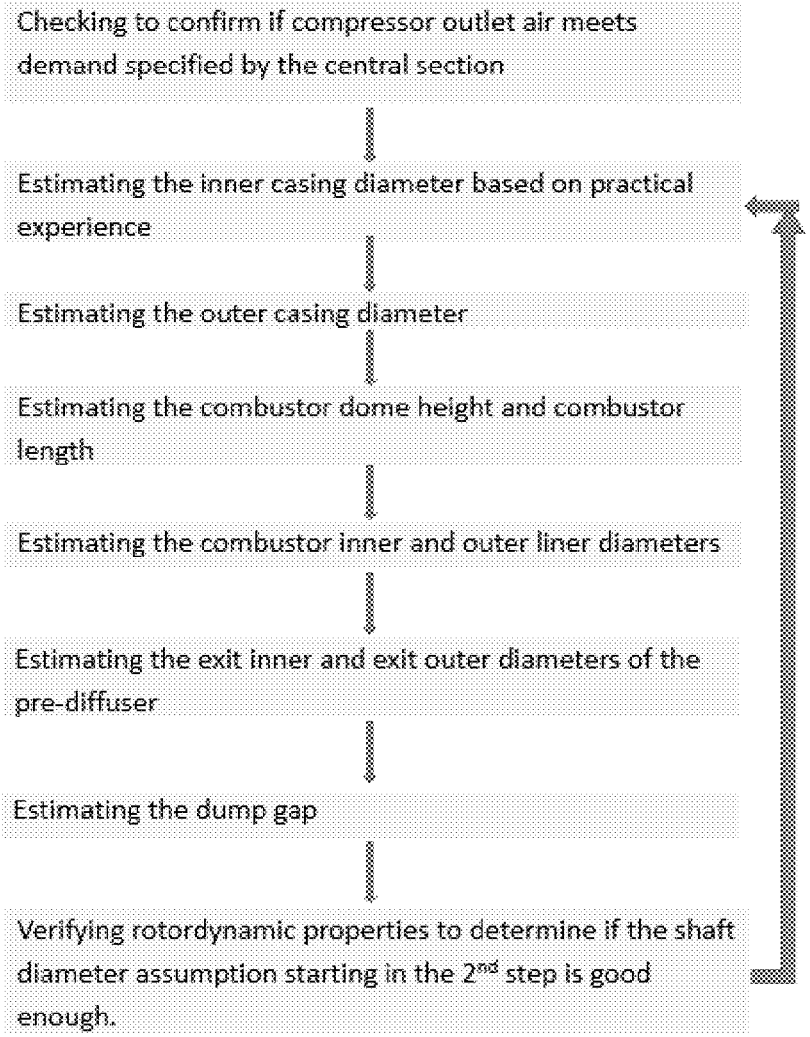
FIG. 2 describes the design flowchart of the central section of small gas turbine engines.
Figure 3:
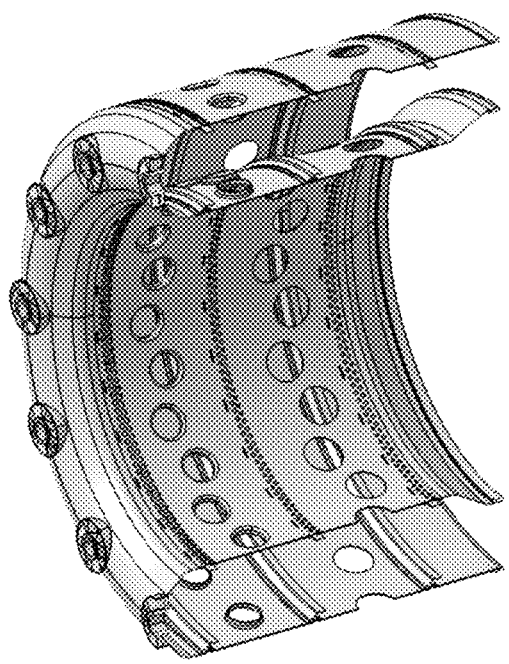
FIG. 3 describes the illustration of a simple straight annular combustor.
Figure 4:
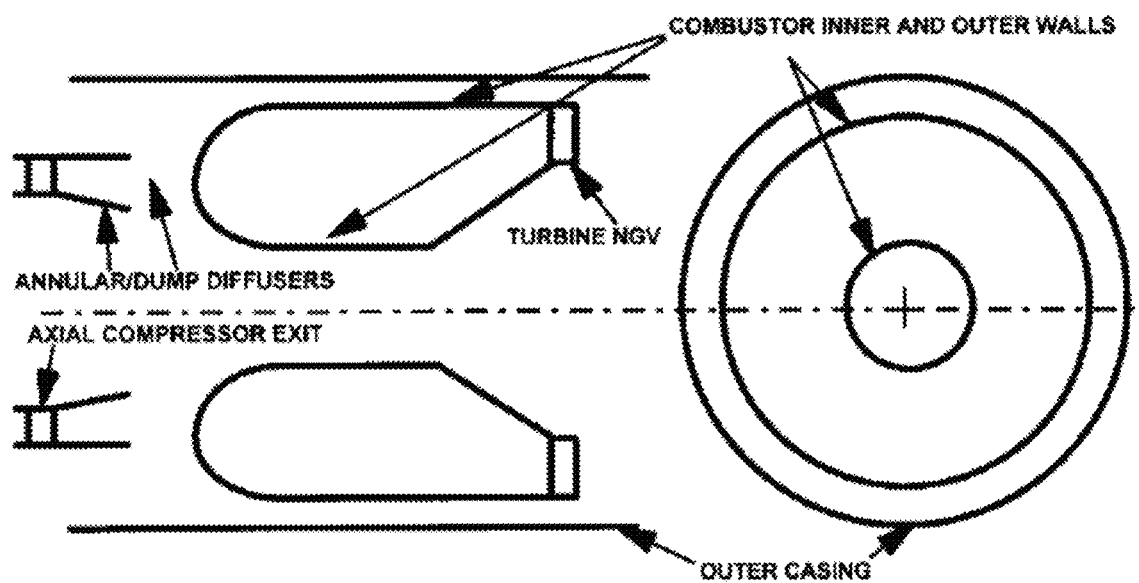
FIG. 4 describes the typical central sections with its components (Noted that the pre-diffuser concept in this patent is also called as diffuser here and the combustor liners are called as walls here)

Referring to the FIG. 2, the aerodynamic design method of the central section of small size gas turbine engines is conducted step by step as follows:

1$^{st}$ step: Checking to confirm if compressor outlet air meets demand specified by the central section The compressor exit plane is also the inlet plane of the pre-diffuser device; therefore, compressed air quality must meet the requirements of speed and angle direction. These requirements are based on the applicant's internal experience.

The higher the compressed air's delivery speed, the higher pressure loss due to friction in the central section, causing higher engine thrust loss. On another hand, lower compressed air's delivery speed causes higher diffusion, making compressor design more difficult. So the ideal speed is chosen to be in range of 0.2 Mach-0.4 Mach.

Similarly, compressed air's discharged angle should be as close to axial direction as possible (in range that the compressor is still workable) in order to minimize loss that is caused by actual longer moving distance of non-straight air movement for the same axial distance. Discharged angle is recommended to be in range of −5 degrees to +5 degrees to axial direction.

If these conditions above are not satisfied, the compressor must be re-designed to meet the requirement of the central section.

2$^{nd}$ step: Estimating the inner casing diameter based on practical experience Unlike many reference documents in which only aerodynamic aspects are considered; in this invention, minimum shaft diameter needed to satisfy rotordynamic properties at engine operating speed is taken into account first.

Engine's shaft diameter is firstly estimated from internal experience with other engines of the same class. After determination of the possible range of the shaft diameter, the inner casing diameter is determined by the space larger than the shaft diameter to arrange bearings, lubrication system and for integration process. There will be several values of shaft diameter being tested to assess its influence to engine's rotordynamic properties and overall engine diameter which is actually the outer casing diameter. The value that meets rotordynamic requirement (dictated by rotating speed asked by the compressor) gives minimum outer casing diameter (shown calculation steps later) will be chosen.

In addition, the inner casing is designed to satisfies both aerodynamic requirement and structural requirement.

The structural requirement is met by guiding the inner casing to the hub of the last stage compressor's stator. By this way, centrifugal loads from engine rotor is transferred via bearing(s) to the inner casing, and then loads are transferred to the compressor's last stage stator structure, to the engine's outer casing and to engine hanging points finally.

The aerodynamic demand is met via the inclination angle between the inner casing and the compressor's last stage stator.

3$^{rd}$ step: Estimating the outer casing diameter

The outer casing diameter is determined by inner casing diameter plus reference area. Reference area is the cross sectional area between the outer and the inner casing.

Reference area is calculated by the formula relating overall (total) pressure loss which is approximately 5%-7%, pressure loss factor which is ranged from 20 times to 30 times and input from compressor exit condition as follows.

$$A_{ref} = \left[\frac{R}{2}\left(\frac{\dot{m}_3 T_3^{0.5}}{P_3}\right)^2 \frac{\Delta P_{3-4}}{q_{ref}}\left(\frac{\Delta P_{3-4}}{P_3}\right)^{-1}\right]^{0.5}$$

Where $A_{ref}$: reference area $\dot{m}_3$: air mass flow rate discharged from the compressor into the central section R: air constant (R=271 J/kg·K)

Figure 1:
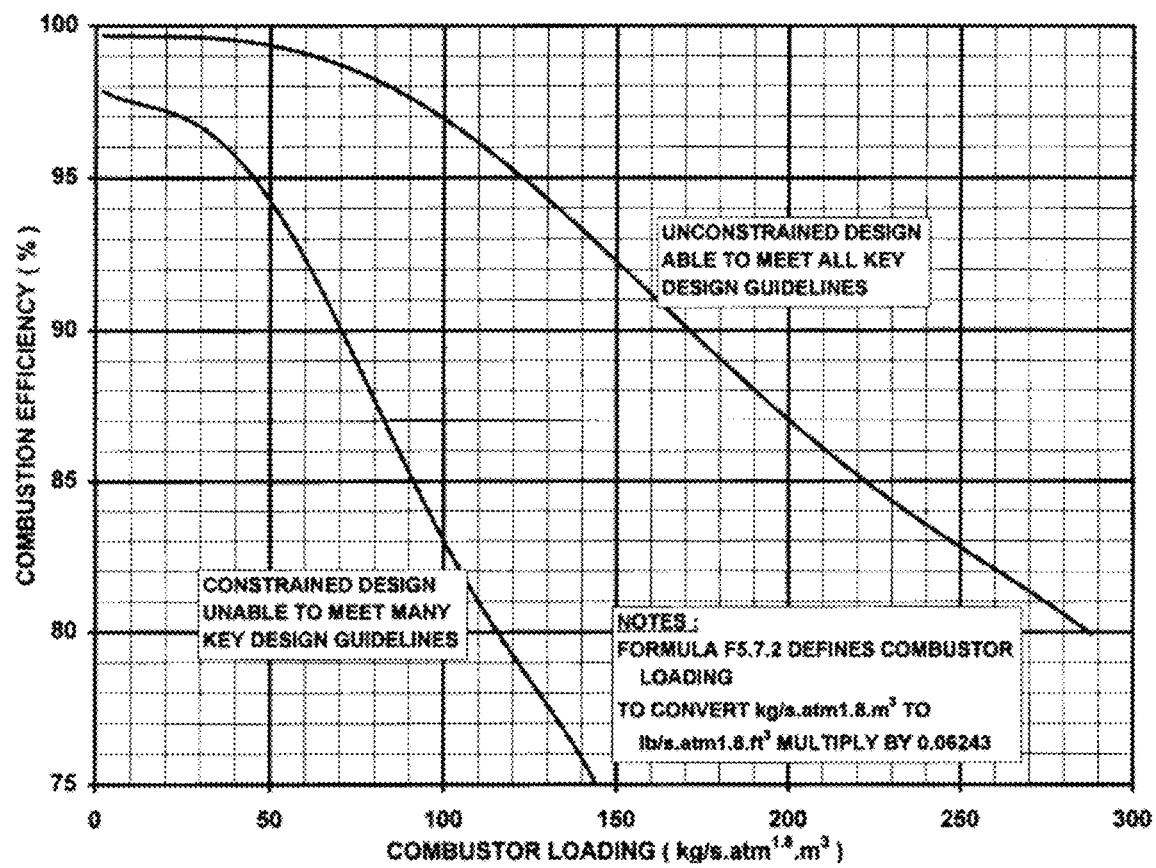
FIG. 1 describes the correlation between combustor loading and combustor efficiency.

$T_3$: total temperature after compressor $P_3$: total pressure after compressor $\Delta P_{3-4}/P_3$: overall pressure loss $\Delta P_{3-4}/q_{ref}$: pressure loss factor 4$^{th}$ step: Estimating the combustor dome height and combustor length Combustor dome height and combustor length allows quick estimation of combustor volume by the product of combustor cross sectional area and combustor length. Combustor dome height and combustor length are justified if the estimated volume can meet the requirement of combustor loading. At this stage, combustor volume cannot be calculated with high accuracy because the combustor is not a perfect annular body. However, the exact level is good enough for combustor loading estimation purpose. In combination with compressor discharged condition, combustor loading can be roughly calculated, showing relatively well which combustion efficiency region it can offer. Combustor loading is inversely proportional to combustion efficiency and it must be in specified range of being less than 50 kg/s·atm$^{1.8}$·m$^3$. Referring to the FIG. 1, it illustrates qualitatively this principle, where the higher combustor loading, the lower combustion efficiency. The specific value of combustion efficiency depends on detailed designs on case-by-case basis.

On another hand, there is a practical relation between combustor length and its dome height where the length is approximately 3 times of the dome height. Therefore, the rule of thumb of estimating combustor dome height and its length is essentially started from the criterion of combustor loading.

5$^{th}$ step: Estimating the combustor inner and outer liner diameters

So far, inner and outer casing diameter, combustor dome height and combustor length have been determined. The next thing to do is to locate the combustor relative to the reference area in between the inner and outer casing.

In this invention's method, the location of the combustor is determined by meeting both the two following conditions: the ratio of combustor liner's cross sectional area to the reference are and the ratio of the outer annulus channel's cross sectional area to that of inner annulus channel. Those values are case-by-case basis but usually it ranges from 0.6 to 0.8 and from 1.5 to 2.0, respectively.

6$^{th}$ step: Estimating the exit inner and exit outer diameters of the pre-diffuser The pre-diffuser is to slow down the air stream discharged by the compressor before discharging it into the dump region where it is further slowed down. In the dump region, air is distributed to the combustor dome, the inner annulus channel, the outer annulus channel.

The pre-diffuser's inner and outer exit diameter are calculated by obeying two (02) criteria: area ratio (AR) and direction guided to combustor's dome center. The common area ratio is of 1.5-2.0 times.

Furthermore, pre-diffuser's axial length is built up by the ratio of length to the last compressor stator's height being in range of 1.5-4.0 times, depending mostly on mechanical reasons on each different engines.

$7^{th}$ step: Estimating the dump gap

Figure 5:
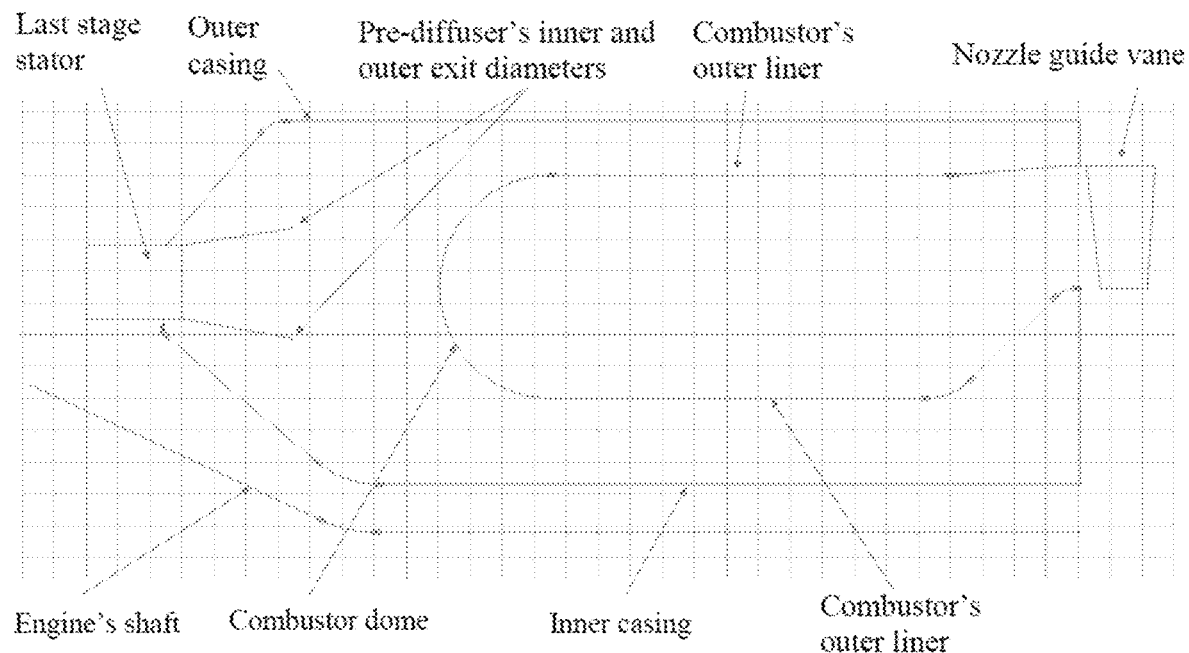
FIG. 5 describes the sectional cut of the central section designed by this method.

The distance from the pre-diffuser's exit plane to the farthest points on the combustor's dome, i.e. the dump gap is determined by the ratio to the last compressor stator's height, it ranges from 1.5 to 4.0 times. The higher this ratio, the higher chance the airflow discharged from the pre-diffuser is distributed properly into the combustor dome, the inner and outer annulus channels. However, the longer dump gap means the longer engine shaft, which affects negatively to the shaft's rotordynamic properties. Also, space needed to arrange mechanical devices such as bearing and lubrication system should be taken into account. Therefore, an appropriate distance for aerodynamic reason, rotordynamic reason and mechanical reason will be chosen on case-by-case basis. FIG. 5 describes a meridional section cut of the central section designed by this method.

$8^{th}$ step: Verifying rotordynamic properties to determine if the shaft diameter assumption starting in the $2^{nd}$ step is good enough. If not, initiating the new design loop by increasing the shaft diameter, hence the inner casing diameter.

After completing one design loop, engine shaft must undergo rotordynamic analysis to confirm if its properties associated with given diameter above are appropriate for engine operation. If its stiffness is weak for high speed rotation, shaft diameter will be increased gradually, for example, 2 mm each step to initiate new design loop. Parametric analysis is also necessarily conducted to see the effect of shaft diameter increment to engine overall size which is essentially the outer casing diameter.

Once rotordynamic properties are secured, aerodynamic simulation will be conducted to examine if flow properties and/or distribution follows the design idea. If not, design ratio mentioned above will be adjusted.

The invention claimed is:

1. An aerodynamic design method of a small size gas turbine central section comprising 8 following stages:

Step 1: checking to confirm if a compressor outlet air meets a demand specified by a central section;

At this stage, a compressor's discharged air must meet a demand of direction and speed;

In details, speed must be in a range of 0.2 M 0.4 M and a flow angle is recommended not having an inclination of more than 5 degrees in an axial direction;

Step 2: estimating an inner casing diameter;

The inner casing diameter at step 2 is determined by a first-predicted shaft diameter value, and then a minimum space needed to arrange mechanical devices including bearings and lubrication systems as well as integration process;

Step 3: estimating an outer casing diameter;

The outer casing diameter at step 3 is determined by adding the inner casing diameter and a reference area;

the reference area is an annular cross sectional area between the outer and the inner casing;

It is estimated by information from an overall pressure loss values from 5% to 7%, a pressure loss factor values of 20 times to 30 times and an air flow discharged after the compressor's information;

Step 4: estimating a combustor dome height and a combustor length;

Here a criteria of combustor loading justifies the estimated combustor dome height and combustor length;

a combustor volume is estimated by a product of combustor's cross sectional area and the combustor length;

Step 5: estimating a combustor inner and outer liner diameters;

Here based on determined information from the inner casing diameter, the outer casing diameter, the combustor dome height and the combustor length, the combustor is positioned by satisfying both following conditions:

a ratio of combustor's cross sectional area to the reference area and a ratio of an outer annulus area to an inner annulus area must be in ranges from 0.6 to 0.8 and from 1.5 to 2.0, respectively;

Step 6: estimating an exit inner diameter and an exit outer diameter of a pre-diffuser;

The pre-diffuser is to slow down the compressor's discharged air flow before distributing the discharged airflow into an inner annulus channel, an outer annulus channel and a dome flow;

The pre-diffuser's exit inner and outer diameters are determined by two following guidelines: area ratio of pre-diffuser's exit to its inlet ratio and a direction guided to the combustor's dome center;

Step 7: estimating a dump gap;

The dump gap is calculated by a ratio to a last compressor stator's height and has values from 1.5 to 4.0 times;

A longer dump gap, a higher chance the discharged air flow is distributed properly into the outer annulus channel, the inner annulus channel and the dome surface;

However, the longer dump gap also means a longer engine shaft, which affects negatively to an engine's rotordynamic properties;

therefore, a ratio of dump gap to last stator's height will be chosen by balancing an aerodynamic factor and mechanical factors and a ratio of dump gap to last stator's height depends on specific cases;

Step 8: verifying rotordynamic properties to determine if a shaft diameter assumption starting in the $2^{nd}$ step is appropriate for engine operation;

If not, initiating a new design loop by increasing the shaft diameter, hence the inner casing diameter;

If engine's rotordynamic properties are satisfied all over engine rotational speeds, aerodynamic simulation will be conducted to check again if flow properties/flow distribution ratio obey a predetermined set of design goals;

If not, the one or more of ratios mentioned above, i.e. either a ratio of combustor's cross sectional area to the reference area, a ratio of an outer annulus area to an inner annulus area, area ratio of pre-diffuser's exit to its inlet ratio or dump gap ratio will be adjusted until flow properties/flow distribution ratio obey a predetermined set of aerodynamic design goals.

* * * * *